(12) United States Patent
Nakamura et al.

(10) Patent No.: US 9,806,821 B2
(45) Date of Patent: Oct. 31, 2017

(54) OPTICAL SIGNAL GENERATOR

(71) Applicant: Oclaro Japan, Inc., Kanagawa (JP)

(72) Inventors: Atsushi Nakamura, Nagano (JP);
Shunya Yamauchi, Kanagawa (JP);
Yoriyoshi Yamaguchi, Kanagawa (JP);
Noriko Sasada, Kanagawa (JP);
Nozomu Yasuhara, Kanagawa (JP);
Takayoshi Fukui, Kanagawa (JP);
Hiroki Irie, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/169,796

(22) Filed: Jun. 1, 2016

(65) Prior Publication Data

US 2016/0365929 A1  Dec. 15, 2016

(30) Foreign Application Priority Data

Jun. 9, 2015 (JP) .................................. 2015-116486

(51) Int. Cl.
| H04B 10/54 | (2013.01) |
| H01S 5/12 | (2006.01) |
| H04Q 11/00 | (2006.01) |
| H01S 5/026 | (2006.01) |
| H01S 5/042 | (2006.01) |
| H01S 5/022 | (2006.01) |

(52) U.S. Cl.
CPC ........... *H04B 10/54* (2013.01); *H01S 5/0265* (2013.01); *H04B 10/541* (2013.01); *H04Q 11/0003* (2013.01); *H01L 2224/48091* (2013.01); *H01S 5/02248* (2013.01); *H01S 5/0425* (2013.01); *H01S 5/12* (2013.01)

(58) Field of Classification Search
CPC combination set(s) only.
See application file for complete search history.

(56) References Cited

U.S. PATENT DOCUMENTS

| 6,678,479 B1 | 1/2004 | Naoe et al. | |
| 2003/0011854 A1* | 1/2003 | Kahn | H04B 10/5161 398/141 |

(Continued)

FOREIGN PATENT DOCUMENTS

| JP | 2001-221985 A | 8/2001 |
| JP | 2005-352219 A | 12/2005 |
| JP | 2010-507131 A | 3/2010 |

*Primary Examiner* — David Payne
*Assistant Examiner* — Omar S Ismail
(74) *Attorney, Agent, or Firm* — Mattingly & Malur, PC

(57) ABSTRACT

Multilevel optical intensity modulation high in accuracy is performed using electro-absorption optical modulators. There is provided a plurality of EA modulators connected in series in a path of an optical signal from a light source, and a multilevel-coded modulated optical signal is generated by modulating an intensity of an input optical signal from the light source based on a modulation signal using the EA modulators. Each of the EA modulators is switched between an ON state and an OFF state of optical absorption in accordance with the modulation signal. Regarding an extinction ratio of the ON state to the OFF state in each of the EA modulators, the EA modulators have respective values difference from each other, and are arranged in ascending order of the extinction ratio from the light source side.

13 Claims, 14 Drawing Sheets

(56) References Cited

U.S. PATENT DOCUMENTS

| | | | | |
|---|---|---|---|---|
| 2005/0275920 A1* | 12/2005 | Sumi | ............ | B82Y 20/00 359/241 |
| 2008/0095486 A1* | 4/2008 | Shastri | ............ | G02F 1/0123 385/3 |
| 2014/0369638 A1* | 12/2014 | Doerr | ............ | G02F 1/2257 385/3 |

* cited by examiner

OPTICAL SIGNAL GENERATOR

CROSS-REFERENCE TO RELATED APPLICATION

The present application claims priority from Japanese application JP2015-116486 filed on Jun. 9, 2015, the content of which is hereby incorporated by reference into this application.

BACKGROUND OF THE INVENTION

1. Field of the Invention

The invention relates to an optical signal generator for generating a multilevel-coded optical signal using an electro-absorption optical modulator.

2. Description of the Related Art

The optical communication system is required to achieve an increase in capacity for transmission information and an increase in transmission range, and in accordance with the requirement, the optical transmitter module is required to achieve a higher transmission rate and a lower chirp operation. The optical transmission module generates a modulated optical signal having been modulated based on a modulation signal representing the transmission information. As the modulation system, there can be cited a direct modulation system for directly modulating the optical intensity using a laser diode, and an external modulation system for modulating output light of a laser diode, and among these systems, the external modulation system is superior in chirp characteristics.

The optical transmitter module of the external modulation system may be constituted using an optical semiconductor element including a light emitting part and a modulating part integrated with each other. As the optical modulator used for the modulating part, there can be cited a Mach-Zehnder optical modulator (MZ modulator), an electro-absorption optical modulator (EA modulator), and so on.

The MZ modulator divides the wave of the input optical signal into two light paths and varies the intensity of the light using the interference between the two light paths. The MZ modulator can control the optical intensity of the multiplexed light by controlling the phase difference between the light paths.

The EA modulator has a structure of sandwiching a semiconductor layer (multiple quantum well (MQW) active layer) for forming a multiple quantum well by p-type and n-type semiconductor layers, and absorbs to quench the light using a phenomenon that the absorption edge wavelength of the light is shifted toward the long-wavelength side in accordance with the voltage applied to the quantum well (quantum confined Stark effect) to thereby control the intensity of the output light.

Since the MZ modulator has a structure of branching and merging the waveguide, in the case of forming the MZ modulator with a semiconductor element, the element size can be larger compared to the EA modulator. Further, a high dimensional accuracy is required for the formation of the waveguide. In contrast, the EA modulator is smaller in size and simpler in structure than the MZ modulator, and it is relatively easy to reduce the manufacturing cost.

As a technology of achieving an increase in capacity for transmission information and an increase in transmission rate, there can be cited a multilevel coding technology for expressing three or more levels with a single code such as a four-level pulse-amplitude modulation (PAM4) signal, and use of the technology has been studied also in the optical communication system. In Japanese Translation of PCT International Application Publication No. JP-T-2010-507131, for example, there is described a technology of performing multilevel coding using the MZ modulator.

SUMMARY OF THE INVENTION

An extinction ratio in the EA modulator depends on the length of the EA modulator (modulator length) and the applied voltage from a drive circuit to the EA modulator, and the longer the modulator length is, and the higher the applied voltage is, the higher the extinction ratio becomes. Here, even if the extinction ratio is the same, the higher the intensity of the input light is, the larger the absolute value of the light absorbed and quenched by the EA modulator becomes, and the higher the photocurrent generated by the EA modulator becomes. Therefore, the electrical characteristics of the EA modulator viewed from the drive circuit vary in accordance with the intensity of the input light to the EA modulator. For example, the impedance of the EA modulator varies due to the increase in the photocurrent, and impedance mismatching can occur between the EA modulator and the drive circuit.

As an optical signal generator for performing the multilevel coding using the EA modulator, it is possible to consider a device having a plurality of EA modulators connected in series to each other, and changing the total extinction amount in a plurality of levels using the combination of the ON state/OFF state of the EA modulators. In such a device, due to the variation of the electrical characteristics described above, even if the drive circuit outputs a constant applied voltage to the EA modulator in a certain stage, for example, the extinction ratio in the EA modulator can be varied in accordance with the light intensity input from the EA modulator in the anterior stage. We have found the fact that the intensity of the multilevel optical signal generated by the device in question fails to have regular intervals accordingly, and there is a problem that the quality as a multilevel code degrades.

This problem will be described using a specific example. Table 1 is a table showing the extinction ratio with respect to the maximum output, and the extinction ratio with respect to the next higher intensity level in the case of setting the intensity ratio of the multilevel (LV=3, 2, 1, 0) optical output compatible with PAM4 to 10:7:4:1.

TABLE 1

| LV | INTENSITY RATIO OF OPTICAL OUTPUT | EXTINCTION RATIO TO MAXIMUM OUTPUT (dB) | EXTINCTION RATIO TO NEXT HIGHER LV (dB) |
| --- | --- | --- | --- |
| 3 | 10 | 0.0 | — |
| 2 | 7 | 1.5 | 1.5 |
| 1 | 4 | 4.0 | 2.4 |
| 0 | 1 | 10.0 | 6.0 |

FIG. 14 is a block diagram showing an example of an optical transmitter module for generating a PAM4 signal using three EA modulators. The three EA modulators EA01 through EA03 are connected in series to each other sequentially from the light source S side. Further, there are provided drive circuits DR01 through DR03 corresponding respectively to the EA modulators EA01 through EA03. The drive circuits DR01 through DR03 switch the voltages applied to the EA modulators EA01 through EA03 to control ON/OFF of the extinction operation of the EA modulators EA01 through EA03, respectively. By setting the extinction ratio of the EA modulator EA01, EA02, EA03 to 6.0 dB, 2.5 dB, 1.5 dB, respectively, so as to correspond to the extinction ratios between the levels of the light intensity shown in Table 1, it can be expected to obtain the intensity ratios shown in Table 1 in the output light $S_{OUT}$. Here, the output voltages of the drive circuits DR01 through DR03 are commonly set, and the extinction ratios different from each other are obtained due to the difference in modulator length between the EA modulators EA01 through EA03.

TABLE 2

| LV | EA01 | EA02 | EA03 |
|---|---|---|---|
| 3 | OFF | OFF | OFF |
| 2 | OFF | OFF | ON |
| 1 | OFF | ON | ON |
| 0 | ON | ON | ON |

Table 2 is a table showing combinations of the ON/OFF states of the EA modulators EA01 through EA03 when obtaining the levels LV of PAM4 in the optical transmitter module shown in FIG. 14. For example, in the case of setting the $S_{OUT}$ to LV=2, only the EA modulator EA03 disposed at the third stage is set to the ON state. In this case, the relative intensity I of the light input to the EA modulator EA03 is 10, and the EA modulator EA03 quenches the input light as much as 1.5 dB to output the light with I=7.

In the case of setting the $S_{OUT}$ to LV=1, the EA modulator EA02 disposed at the second stage is additionally set to the ON state. On this occasion, the light obtained by quenching the light with I=10 as much as 2.4 dB is input to the EA modulator EA03, the intensity of the light becomes around I=5.7, which is smaller than in the case of LV=2, and the photocurrent generated in the EA modulator EA03 also decreases accordingly. As a result, the impedance of the EA modulator EA03 varies to decrease the effective applied voltage from the drive circuit DR03 to the EA modulator EA03, and the extinction ratio of the EA modulator EA03 becomes lower than 1.5 dB. Therefore, the total extinction ratio of the EA modulators EA02 and EA03 is shifted from 4.0 dB, and the intensity of $S_{OUT}$ is shifted from the target of I=4.

Further, in the case of setting all of the EA modulators EA01 through EA03 to the ON state to thereby set $S_{OUT}$ to LV=0, the extinction ratio of the EA modulator EA02 decreases to a level lower than 2.4 dB obtained in the impedance matching state due to the same phenomenon as described above with respect to the EA modulator EA03 in the case of LV=1. Further, since the input light to the EA modulator EA03 decreases to a level lower than in the case of LV=1, and the degree of the impedance mismatching increases, the extinction ratio of the EA modulator EA03 further decreases. As a result, the intensity of $S_{OUT}$ is shifted from the target of I=1.

In this example, it is possible to correct the shift of $S_{OUT}$ of PAM4 described above by adjusting the output voltages of the drive circuits DR01, DR02, and DR03 in accordance with the level of PAM4, but there is a problem that the configuration of the drive circuit and the control thereof become complicated.

The invention is made for solving the problems described above, and is related to an optical signal generator for modulating the light intensity using an electro-absorption optical modulator to generate a multilevel-coded optical signal, and realizes a multilevel optical intensity modulation higher in accuracy with a simpler structure.

(1) An optical signal generator according to an aspect of the invention is a device provided with a plurality of modulation parts connected in series in a path of an optical signal, and adapted to generate a multilevel-coded modulated optical signal by modulating an intensity of an input optical signal from a light source based on a modulation signal using the modulation parts, and including an electro-absorption optical modulator provided to each of the modulation parts, and switched between an ON state of optical absorption and an OFF state of the optical absorption in accordance with the modulation signal, wherein regarding an extinction ratio of the ON state to the OFF state in each of the modulation parts, at least two of the modulation parts have respective values different from each other, and the modulation parts having the respective extinction ratios different from each other are located so that the lower the extinction ratio is, the closer to the light source the modulation part is located.

(2) In the optical signal generator according to a preferred aspect of the invention, in the plurality of modulation parts, the lower the extinction ratio is, the shorter the modulator length of the electro-absorption optical modulator is.

(3) In any one of the optical signal generators according to one preferred aspects described in (1) and (2), when setting arbitrary one of the electro-absorption optical modulators to the ON state, all of the electro-absorption optical modulators located on the light source side of the arbitrary one of the electro-absorption optical modulators in the path are also set to the ON state.

(4) According to another preferred aspect of the invention, in the optical signal generator described in any one of (1) through (3), the modulation parts all have the respective extinction ratios different from each other, and arranged in ascending order of the extinction ratio from the light source side.

(5) The optical signal generator described in one of (2) and (4) may be configured such that each of the modulation parts has a drive circuit adapted to apply one of drive voltages corresponding respectively to the OFF state and the ON state to the electro-absorption optical modulator, and the drive voltages are common to the modulation parts.

(6) The optical signal generator described in any one of (1) through (5) may be configured such that the optical signal generator further includes a control section adapted to generate a binary control signal used to control ON/OFF of each of the modulation parts from the modulation signal, a number of the modulation parts is (N−1) with respect to the multilevel coding with N levels, k is defined as an arbitrary natural number satisfying $1 \leq k \leq N-1$, values $\lambda_k$ arranged in one of ascending order and descending order with respect to a change in k are determined in advance as threshold values for switching between ON/OFF of the $k^{th}$ modulation part, which is the $k^{th}$ modulation part from the light source side, and the control section compares the modulation signal with the threshold value of each of the modulation parts, then, generates the control signal for setting the $\alpha^{th}$ ($\alpha$ is an arbitrary natural number satisfying $1 \leq \alpha \leq N-2$) modulation part to the ON state in a case in which the modulation signal exists in a region on a $\lambda_{\alpha+1}$ side viewed from $\lambda_\alpha$, and generates the control signal for setting the $\beta^{th}$ ($\beta$ is an arbitrary natural number satisfying $2 \leq \beta \leq N-1$) modulation part to the OFF state in a case in which the modulation signal exists in a region on a $\lambda_{\beta-1}$ side viewed from $\lambda_\beta$.

(7) The optical signal generator described in one of (2), (4), and (5) may be configured such that the electro-absorption optical modulator is provided to an optical semiconductor element having a driving electrode pad to which a wire for supplying the electro-absorption optical modulator with the drive voltage is connected, and in the driving electrode pad in each of the modulation parts, the shorter the modulator length is, the larger area the driving electrode pad has.

(8) The optical signal generator described in any one of (1) through (7) may be configured such that the electro-absorption optical modulators of the respective modulation parts are arranged along the path of the optical signal to form an optical semiconductor element, and the optical semiconductor element has an electrode pad, which is not electrically connected to either of the electro-absorption optical modulators, between at least either two of the electro-absorption optical modulators disposed adjacent to each other, and a bonding wire adapted to connect the electrode pad and a direct-current power supply to each other is disposed between the electro-absorption optical modulators adjacent to each other.

(9) The optical signal generator described in any one of (1) through (8) may be configured such that the electro-absorption optical modulators are provided to an optical semiconductor element formed on a semi-insulating substrate, and driving electrode pads of a positive terminal and a negative terminal to which wires for supplying the electro-absorption optical modulator with the drive voltage are connected are both disposed on a principal surface of the optical semiconductor element opposite to the semi-insulating substrate.

(10) The optical signal generator described in (9) may be configured such that the optical signal generator further includes a chip carrier on which the optical semiconductor element is mounted, and the optical semiconductor element is mounted on the chip carrier so that the principal surface, on which the driving electrode pads are disposed, faces downward.

According to the aspect of the invention, there can be obtained the optical signal generator capable of realizing the multilevel optical intensity modulation high in accuracy with a simpler structure using the electro-absorption optical modulators.

DETAILED DESCRIPTION OF THE INVENTION

Some embodiments of the invention will hereinafter be described based on the accompanying drawings.

First Embodiment

The optical signal generator according to the present embodiment is a modulator integrated semiconductor laser element 2 (FIG. 1) having the EA modulators monolithically integrated in front of a semiconductor laser. The element modulates the intensity of an optical signal, which is output by the semiconductor laser, based on a modulation signal to thereby generate a multilevel-coded modulated optical signal. In the present embodiment, there are provided three modulation parts connected in series in the path of the optical signal, and output light $S_{OUT}$ as a PAM4 signal is generated as the modulated signal. Here, the three modulation parts are referred to as first through third modulation parts in sequence from the light source side.

Each of the modulation parts has an EA modulator, which is switched between an ON state and an OFF state of the light absorption in accordance with the modulation signal, and in the present embodiment, the extinction ratio of the ON state to the OFF state is different in value between the modulation parts. Further, the modulation parts having the respective extinction ratios different from each other are disposed so that the lower the extinction ratio of the modulation part is, the closer to the light source the modulation part is located (closer to the semiconductor laser in FIG. 1).

Here, in the case in which the EA modulators are the same in point of the structural features except the modulator length (e.g., MQW), the longer the modulator length is, the higher the extinction ratio of the EA modulator becomes. Further, the extinction ratio can also be made higher by increasing the voltage applied to the EA modulator.

Figure 1:
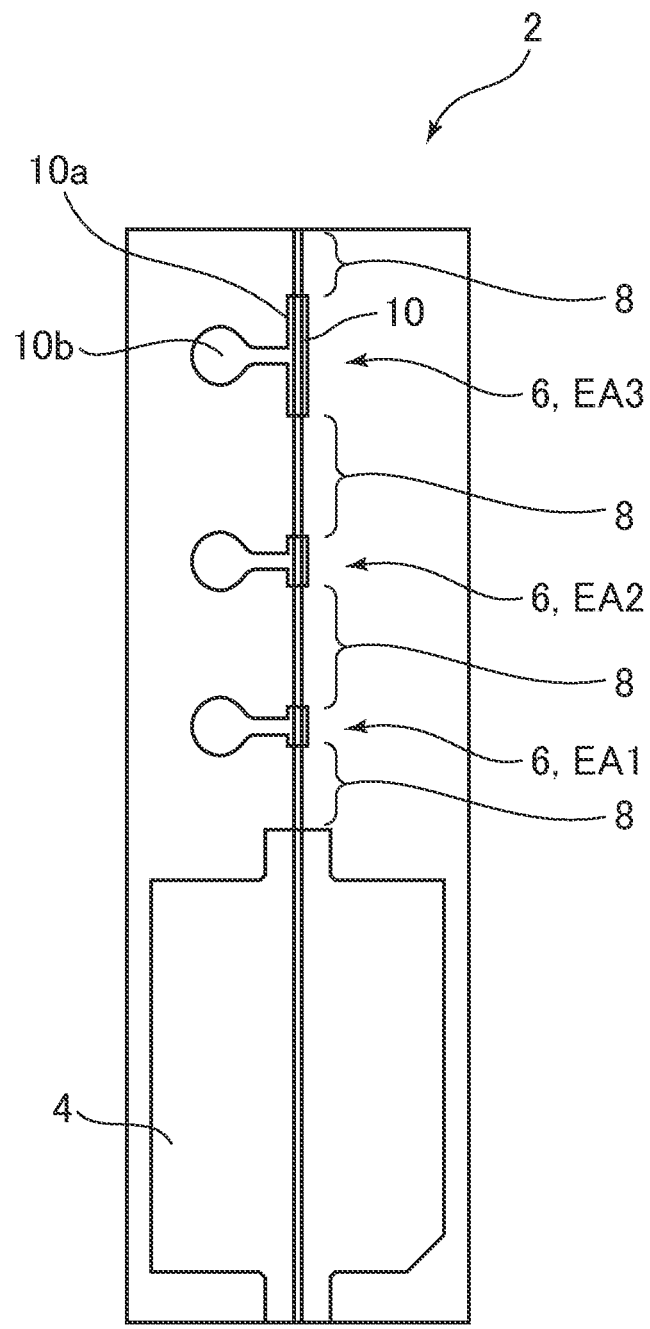
FIG. 1 is a schematic plan view of a modulator integrated semiconductor laser element according to a first embodiment of the invention.

In the present embodiment, the extinction ratios different from each other of the first through third modulation parts are realized by making the modulator length different between the EA modulators. FIG. 1 is a schematic plan view of the modulator integrated semiconductor laser element 2. The modulator integrated semiconductor laser element 2 includes a distributed feedback (DFB) laser part 4, the EA modulators 6 respectively constituting the modulation parts, and waveguides 8. Here, the three EA modulators 6 are denoted by EA1, EA2, and EA3 in sequence from the DFB laser part 4 side. In other words, the EA modulator EAk (k=1, 2, 3) is disposed corresponding to the $k^{th}$ modulation part. By denoting the modulator length of the EA modulator EAk with $L_k$, $L_1<L_2<L_3$ is fulfilled.

The EA modulators EA1 through EA3 are driven by voltages supplied from modulator drivers (drive circuits) disposed outside the modulator integrated semiconductor laser element 2. In the present embodiment, it is assumed that the modulator drivers provided for the respective EA modulators drive the EA modulators in a drive condition common to the modulator drivers. Specifically, the voltage applied when the EA modulators EA1 through EA3 are in the ON state is common to the modulator drivers, and the voltage applied when the EA modulators EA1 through EA3 are in the OFF state is common to the modulator drivers. Specifically, the amplitude and the offset voltage (typically a negative value) of the modulation signal applied to the EA modulators are common to the modulator drivers.

Therefore, the difference in extinction ratio between the modulation parts is basically determined by the difference in the modulator length $L_k$. The difference in the extinction ratio or the modulator length $L_k$ is set based on the difference in level of the PAM4 signal as described later.

As already described, the EA modulators each have the structure of sandwiching the MQW active layer by the p-type and n-type semiconductor layers. In the present embodiment, the n-type semiconductor layer of the EA modulators EA1 through EA3 is formed of an n-type indium-phosphorus (n-InP) substrate, the MQW active layer is formed on the substrate, and a p-type InP (p-InP) area is further formed on the MQW active layer as the p-type semiconductor layer described above. FIG. 1 shows p electrode parts 10 for applying the voltages to the respective p-InP areas of the EA modulators EA1 through EA3. The p electrode parts 10 each have a contact part 10a having ohmic contact with the p-InP area and a pad part 10b. In FIG. 1, the difference in modulator length between the EA modulators EA1 through EA3 appears in the lengths in the light path direction of the contact parts 10a. It should be noted that the pad part 10b is a driving electrode pad for bonding a wire for supplying the EA modulator 6 with the drive voltage, and in FIG. 1, the pad part 10b has a roughly circular shape.

Figure 2:
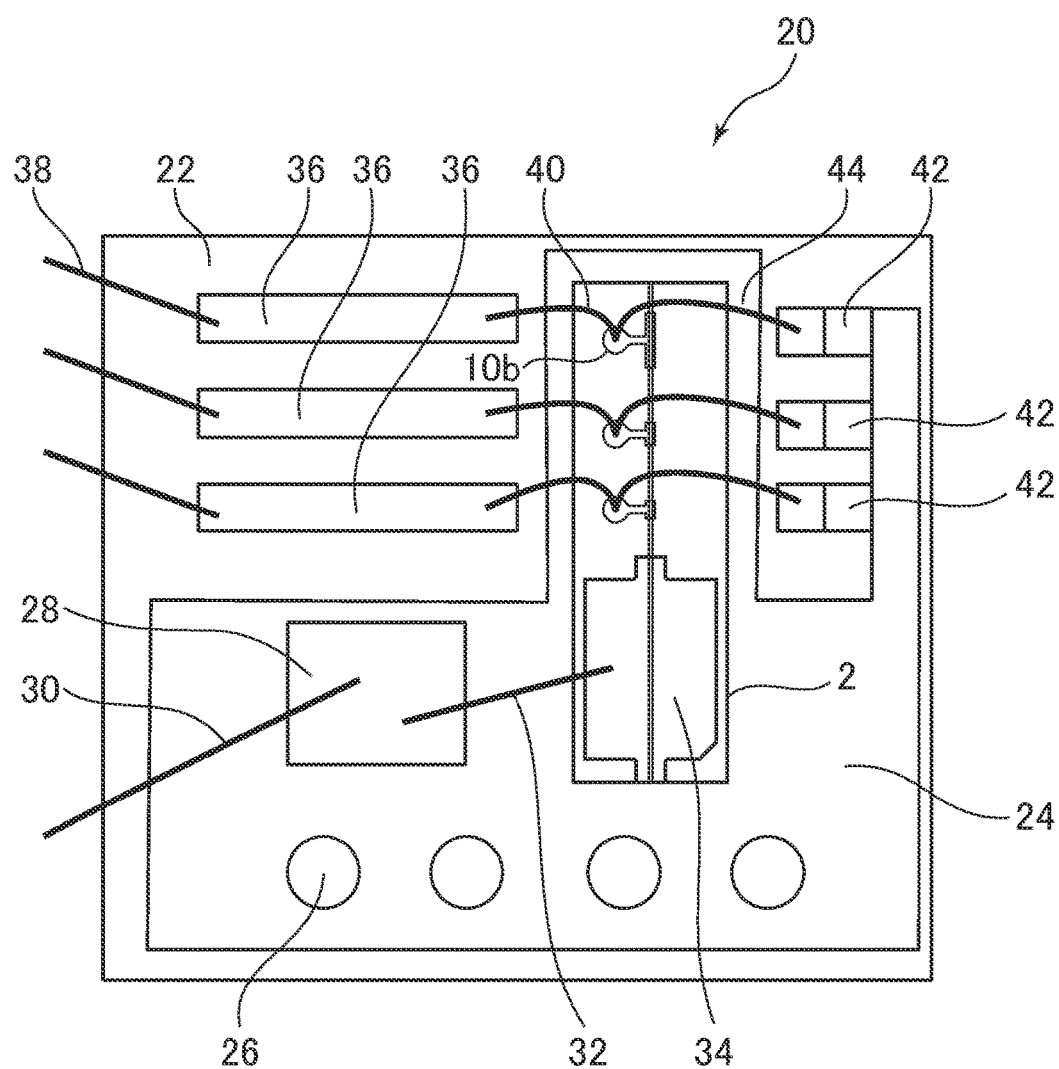
FIG. 2 is a schematic plan view of an optical device according to the first embodiment of the invention.

FIG. 2 is a schematic plan view showing an optical device 20 having the modulator integrated semiconductor laser element 2 mounted on a chip carrier 22. The optical device 20 is also an aspect of the optical signal generator according to the invention.

On the rear surface of the modulator integrated semiconductor laser element 2, there is disposed a rear surface electrode having ohmic contact with the n-InP substrate. The modulator integrated semiconductor laser element 2 is disposed on a ground electrode 24 formed on an upper surface of the chip carrier 22, and the rear surface electrode of the modulator integrated semiconductor laser element 2 and the ground electrode 24 of the chip carrier 22 are electrically connected to each other. It should be noted that the ground electrode 24 is connected to an electrode located on the rear surface side of the chip carrier 22 via a via hole 26.

Further, a chip capacitor 28 is also mounted on the ground electrode 24 as a bypass capacitor. In the DFB laser part 4, a laser diode is supplied with a forward DC current $I_{bias}$ via wires 30, 32 and a p electrode part 34 from an external laser driver (not shown), and a laser beam is continuously output. The bypass capacitor is connected between signal lines (the wires 30, 32) and the ground electrode 24 in parallel to the laser diode to remove a noise component which can be included in the DC current $I_{bias}$.

Each of the EA modulators 6 is supplied with a drive signal having a voltage switched at a high frequency corresponding to the modulation signal from the modulator driver (not shown) located outside. On the chip carrier 22, there are formed high-frequency lines 36 corresponding respectively to the EA modulators, the drive signals are transmitted to the high-frequency lines 36 from the modulator drivers located outside the chip carrier 22 via wires 38, and are then applied to the pad parts 10b via wires 40, respectively.

On the chip carrier 22, there are formed thin film resistors 42 as terminating resistors of the respective EA modulators EA1 through EA3. One ends of the thin film resistors 42 are connected to the ground electrode 24, and the other ends are connected to the pad parts 10b via wires 44, respectively.

Figure 3:
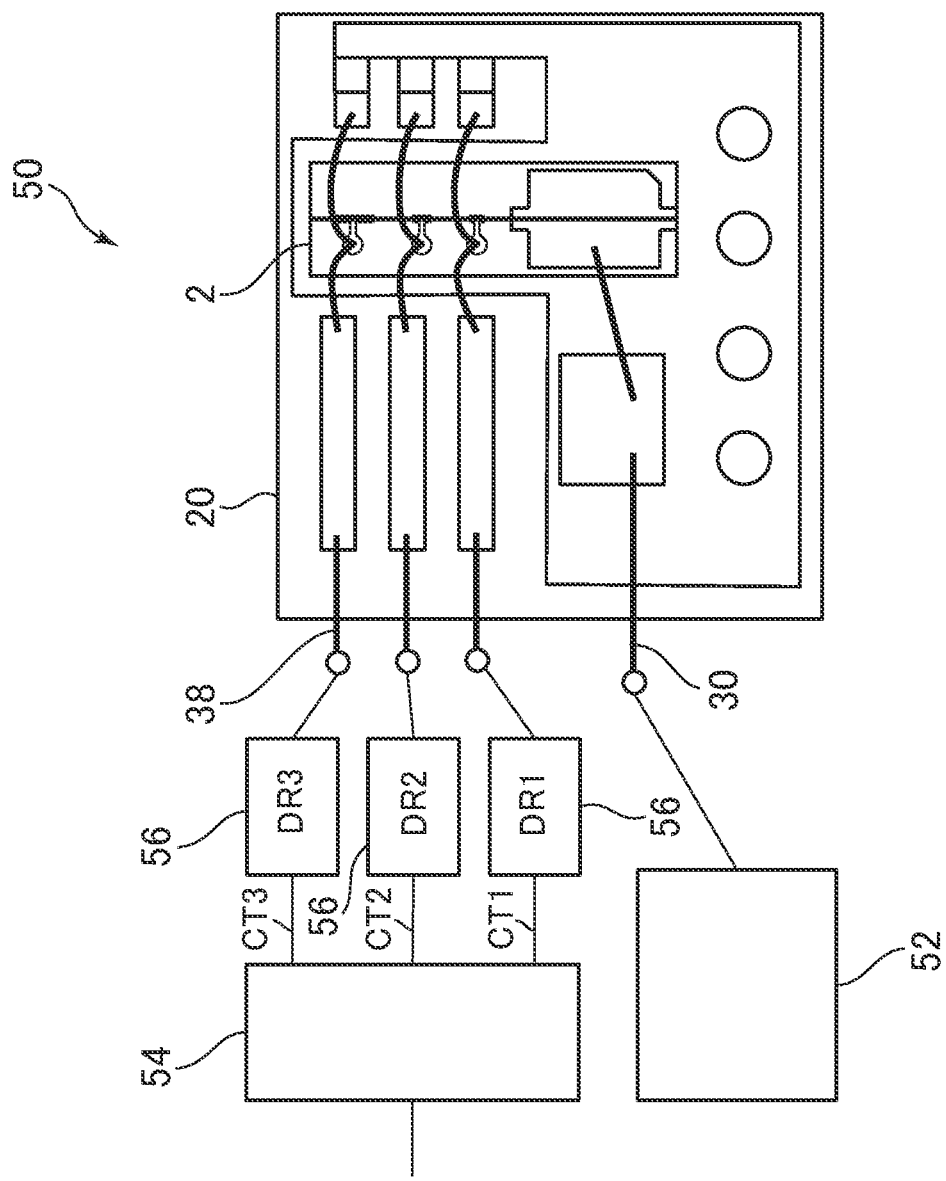
FIG. 3 is a schematic diagram of an optical transmitter module according to the first embodiment of the invention.

FIG. 3 is a schematic diagram of the optical transmitter module 50 configured using the optical device 20 shown in FIG. 2. The optical transmitter module 50 is also an aspect of the optical signal generator according to the invention. The optical transmitter module 50 includes an optical device 20, the laser driver 52, a modulation control section 54, and the modulator drivers 56.

The laser driver 52 generates the DC current $I_{bias}$ and supply the DFB laser part 4 with the DC current $I_{bias}$.

The modulation signal is input to the modulation control section 54, and the modulation control section 54 generates binary control signals for controlling ON/OFF of the respective modulation parts from the modulation signal. Here, the number of levels of the multilevel coding of the output light $S_{OUT}$ of the modulator integrated semiconductor laser element 2 is denoted by N. In the present embodiment, the number is set to N=4, and the (N−1) modulation parts, namely the first through third modulation parts described above, are provided corresponding to the number N. The constituents of the modulation parts in the modulator integrated semiconductor laser element 2 are basically the EA modulators, but the modulator drivers 56 are added as the constituents of the modulation parts in the optical transmitter module 50. In other words, the modulator drivers 56 are provided to the respective modulation parts, the modulation control section 54 generates the control signals to the respective modulator drivers 56, and the modulator drivers 56 of the respective modulation parts drive the EA modulators corresponding to the modulation parts. It is determined that the modulator drivers 56 of the first through third modulation parts are denoted by DR1 through DR3, respectively.

In the case in which, for example, the modulation signal is a PAM signal or an analog voltage signal, the modulation control section 54 classifies the modulation signal into N levels using (N−1) threshold voltages set in advance, and then generates the control signals CTk to the modulation parts DRk (k=1, 2, 3) based on the result.

The correspondence relationship between the modulation signal and the PAM signal level LV of the output light $S_{OUT}$ can be determined so that the higher the voltage of the modulation signal is, the higher the PAM signal level LV becomes, or can also be determined so that the lower the voltage of the modulation signal is, the higher the PAM signal level LV becomes, on the contrary.

In the present embodiment, the extinction ratios of the modulation parts are set so that the modulation parts are arranged in ascending order of the extinction ratio from the light source side. In other words, the plurality of modulators are arranged so that the extinction ratio of the EA modulator disposed nearest to the light source side is the lowest, then the modulators are arranged in ascending order of the extinction ratio, and the EA modulator the furthest from the light source has the highest extinction ratio. Further, the modulation parts are cumulatively set to the ON state in sequence from the light source side, in other words, when setting the EA modulator 6 of any one of the modulation parts to the ON state, the EA modulators 6 of all of the modulation parts located nearer to the light source than that modulation part are also set to the ON state. Thus, in the case in which a certain EA modulator is set to the ON state in two or more LV values, the photocurrent in the ON state of that EA modulator can be made equivalent irrespective of the LV value, the desired extinction ratio can be obtained without fine-tuning the values of the voltages to be applied to the respective EA modulators, and thus, it becomes possible to generate the output light $S_{OUT}$ in which the intervals of light intensity between the adjacent LV values are equal.

Here, the threshold voltage to be the criterion on whether or not the switching between ON and OFF of the $k^{th}$ modulation part is performed is denoted by $\lambda_k$. In order to cumulatively set the modulation parts to the ON state in sequence from the light source side, the switching between ON and OFF of the $k^{th}$ modulation part is determined using the threshold voltage $\lambda_k$ in the following manner. In the case of making the determination so that the higher the voltage of the modulation signal is, the higher the signal level LV becomes, the threshold voltage $\lambda_k$ is determined so as to descend as k increases, and the $k^{th}$ modulation part is set to the OFF state in the case in which the voltage of the modulation signal exceeds the threshold voltage $\lambda_k$, and the $k^{th}$ modulation part is set to the ON state in the case in which the voltage of the modulation signal falls below the threshold voltage $\lambda_k$, on the contrary. In contrast, in the case of making the determination so that the smaller the amplitude (the lower the voltage) of the modulation signal is, the higher the signal level LV becomes, the threshold voltage $\lambda_k$ is determined so as to ascend as k increases, and the $k^{th}$ modulation part is set to the OFF state in the case in which the voltage of the modulation signal falls below the threshold voltage $\lambda_k$, and the $k^{th}$ modulation part is set to the ON state in the case in which the voltage of the modulation signal exceeds the threshold voltage $\lambda_k$, on the contrary.

Specifically, the modulation control section 54 compares the voltage of the modulation signal with the threshold value of each of the modulation parts, and then, generates a control signal CTα (α is an arbitrary natural number satisfying $1 \leq \alpha \leq N-2$) for setting the $\alpha^{th}$ modulation part to the ON state in the case in which the voltage of the modulation signal exists in the region on the $\lambda_{\alpha+1}$ side viewed from the threshold voltage $\lambda_\alpha$, and generates a control signal CT$_\beta$ (β is an arbitrary natural number satisfying $2 \leq \beta \leq N-1$) for setting the $\beta^{th}$ modulation part to the OFF state in the case in which the voltage of the modulation signal exists in the region on the $\lambda_{\beta-1}$ side viewed from the threshold voltage $\lambda_\beta$.

For example, in the case of making the determination so that the higher the voltage A of the modulation signal is, the higher the signal level LV is, the threshold values are set so as to fulfill $\lambda_1 > \lambda_2 > \lambda_3$, and the first modulation part is set to the ON state on the $\lambda_2$ side of the threshold value $\lambda_1$ as a boundary, namely in the case of $A < \lambda_1$, and therefore, the first modulation part is set to the OFF state in the case of $A > \lambda_1$. The second modulation part is set to the ON state on the $\lambda_3$ side of the threshold value $\lambda_2$ as a boundary, namely in the case of $A < \lambda_2$, and further, the second modulation part is set to the OFF state on the $\lambda_1$ side of the threshold value $\lambda_2$ as a boundary, namely in the case of $A > \lambda_2$. Further, the third modulation part is set to the OFF state on the $\lambda_2$ side of the threshold value $\lambda_3$ as a boundary, namely in the case of $A > \lambda_3$, and therefore, the third modulation part is set to the ON state in the case of $A < \lambda_3$. It should be noted that which one of the ON state and OFF state is set in the case in which the voltage A of the modulation signal is equal to the threshold value is arbitrarily determined. In the present embodiment, the modulation control section 54 generates the control signals CT1 through CT3 so that, for example, all of the first through third modulation parts are set to the OFF state in the case of $A \geq \lambda_1$, only the first modulation part is set to the ON state in the case of $\lambda_1 > A \geq \lambda_2$, only the first modulation part and the second modulation part are set to the ON state in the case of $\lambda_2 > A \geq \lambda_3$, and all of the first through third modulation parts are set to the ON state in the case of $\lambda_3 > A$.

Specifically, corresponding to the extinction ratios with respect to the next higher intensity level shown in Table 1, the modulator length $L_1$ of the EA modulator EA1 is set so that the extinction ratio in the first modulation part is 1.5 dB, and the modulator length $L_2$ of the EA modulator EA2 and the modulator length $L_3$ of the EA modulator EA3 are set so that the extinction ratios in the second modulation part and the third modulation part are 2.4 dB, 6.0 dB, respectively. Further, the modulation control section 54 generates the control signals CT1 through CT3 so as to achieve the combination of the ON/OFF states of the EA modulators EA1 through EA3 shown in Table 3 in accordance with the LV value determined based on the result of the classification of the modulation signal.

TABLE 3

| LV | EA1 | EA2 | EA3 |
|----|-----|-----|-----|
| 3  | OFF | OFF | OFF |
| 2  | ON  | OFF | OFF |
| 1  | ON  | ON  | OFF |
| 0  | ON  | ON  | ON  |

The intensity of the light input to the EA modulator EA1 located at the head viewed from the DFB laser part 4 is not affected by the other EA modulators 6, and is therefore constant irrespective of the level LV of the PAM signal generated. Further, in the invention, when setting the EA modulator 6 in any of the modulation parts located in the second and succeeding stages to the ON state, all of the EA modulators 6 located in the anterior stages are in the ON state. Therefore, the intensity of the light input to a certain EA modulator 6 is the same with respect to all of the LV values in which that EA modulator 6 is set to the ON state, and as a result, the amount of the light absorbed and quenched by that EA modulator 6 in the ON state is constant, and thus, the photocurrent is also constant. Therefore, the impedance matching state between the modulator driver 56 and the EA modulator 6 is kept constant with respect to the different LV values. Therefore, the problems described above do not occur, it is easy to make the intensity intervals between the adjacent levels of the output light $S_{OUT}$ accurately equal, and thus, the high-quality PAM optical signal can be generated.

It should be noted that, for example, the extinction ratios of the EA modulators EA1 through EA3 of 1.5 dB, 2.4 dB, and 6.0 dB described above are the extinction ratios in the ON state with reference to the OFF state. Here, the OFF state does not necessarily mean the state in which the input light to the EA modulator 6 is not at all quenched, and it is also possible to define the OFF state as, for example, the state in which a voltage is applied to the EA modulator 6. It should be noted that it is preferable to decrease the amount of the light absorbed and quenched in the OFF state to a minimum value from a viewpoint of accurately equalizing the intensity difference between the adjacent levels of the output light $S_{OUT}$, and it is preferable to set the applied voltage to 0, for example.

In the embodiment described above, it is assumed that the plurality of EA modulators 6 is driven in the drive condition common to the EA modulators 6. In this case, it is possible to make the setting values (e.g., voltage setting) of the respective modulator drivers common to the modulator drivers, and it becomes possible to use the same model of modulator drivers. Thus, since the difference in characteristics between the modulator drivers can be decreased, a harmful influence on the optical waveform due to the modulator drivers can be suppressed. However, in the actual manufacturing process, an individual difference between the modulator drivers and a slight difference in the configuration of the circuit from the modulator driver to the modulator (e.g., a difference in electrical length such as a difference in wire length) occur in some cases. Therefore, in order to finally realize the necessary high-quality optical waveform, it is also possible to perform individually fine-tuning the settings of the modulator drivers. Further, although in the embodiment described above, the extinction ratios in the plurality of modulation parts are made different from each other by making the modulator lengths of the EA modulators 6 different from each other, it is also possible to provide a difference between the extinction ratios by, for example, making the modulator lengths of some of the modulators common to the modulators on the one hand, and making the voltages applied to the respective EA modulators 6 different from each other on the other hand. As described above, according to the invention, it is also possible to obtain an advantage that both of the modulator length and the settings (voltages to be applied) of the modulator drivers can be adjusted and controlled to provide spread to the design.

Further, when making the extinction ratios of the plurality of modulation parts different from each other by making the modulator lengths of the EA modulators different from each other, although in the embodiment described above, the EA modulators of the respective modulation parts are formed integrally using the single p electrode part 10, and the length of the single p electrode part 10 corresponds to the modulator length, the EA modulator 6 of each of the modulation parts can be formed of a plurality of EA modulators separated from each other ON/OFF-controlled by a drive signal common to the plurality of EA modulators. In this case, the sum of the modulator lengths of the plurality of EA modulators in each of the modulation parts corresponds to $L_k$, and the modulation parts are arranged so as to fulfill $L_1<L_2<L_3$ when viewed from the light source side.

Further, it is also possible to further connect additional EA modulators controlled independently of the modulation signal serially to the plurality of EA modulators 6 ON/OFF-controlled in accordance with the modulation signal in order to perform, for example, gain adjustment of the output light $S_{OUT}$. The additional EA modulators can be put outside the coverage of the conditions regarding the EA modulators 6 described above such as the condition that the EA modulators are arranged in ascending order of the modulator length from the light source side, or the condition that the EA modulators are cumulatively set to the ON state in sequence from the light source side.

In the embodiment described above, there is shown the configuration in which the plurality of modulation parts ON/OFF-controlled in accordance with the modulation signal is all provided with the extinction ratios different from each other, and is arranged in ascending order of the extinction ratio from the light source side. Here, it is possible to realize the similar function to the function of the optical transmitter module 50 according to the embodiment described above by, for example, replacing the third modulation part provided with the EA modulator EA3 with the extinction ratio of 6 dB described above with two modulation parts respectively provided with EA modulators EA3', EA3" each having the extinction ratio of 3 dB, configuring the modulation control section 54 so as to formally generate separate control signals to the two modulation parts, and actually performing the ON/OFF control on the two modulation parts at the same time. In other words, in the embodiment, it is also possible to adopt the configuration in which at least two of the plurality of modulation parts ON/OFF-controlled in accordance with the modulation signal have the respective extinction ratios different from each other, but at least two thereof have the same extinction ratio, and the modulation parts having the respective extinction ratios different from each other are arranged so that the lower the extinction ratio of the modulation part is, the closer to the light source the modulation part is located.

In the embodiment described above, there is shown the configuration in which when setting an arbitrary EA modulator 6 to the ON state, all of the EA modulators 6 located closer to the light source than that EA modulator 6 are also set to the ON state. Here, it is possible to adopt a configuration in which, for example, a level (LV=−1 is assumed for the sake of convenience of explanation) having the relative intensity I of the light of 0.8 is set below the four levels of PAM4 of the output light $S_{OUT}$ described above, and a fourth modulation part having an EA modulator EA4 corresponding to the extinction ratio (1 dB) of the optical intensity of the level LV=−1 compared to the optical intensity of the level LV=0 is added to the configuration of the optical transmitter module 50 described above. In this configuration, by disposing the EA modulator EA4 on the light source side of the EA modulator EA1, configuring the modulation control section 54 so as to formally generate the control signal to the fourth modulation part in accordance with the modulation signal, and arranging that the fourth modulation part is actually kept in the OFF state, basically the same function as that of the optical transmitter module 50 according to the embodiment described above can be realized. In other words, in the invention, it is possible to formally adopt the configuration in which when setting an arbitrary EA modulator 6 to the ON state, either of the EA modulators 6 located closer to the light source than that EA modulator 6 is not set to the ON state.

Further, the conversion process in the modulation control section 54 for generating the control signals corresponding to the PAM signal level of the output light $S_{OUT}$ from the modulation signal can be applied to a modulation signal of other types than described above. For example, the modulation signal can be a signal multilevel-coded using phase shift keying or frequency shift keying.

Second Embodiment

The optical device 100 as the optical signal generator according to the second embodiment of the invention will hereinafter be described with a focus on a different point from the first embodiment described above attaching the same reference symbols to the common constituents to the first embodiment and the present embodiment, and basically omitting the description of the common constituents.

Figure 4:
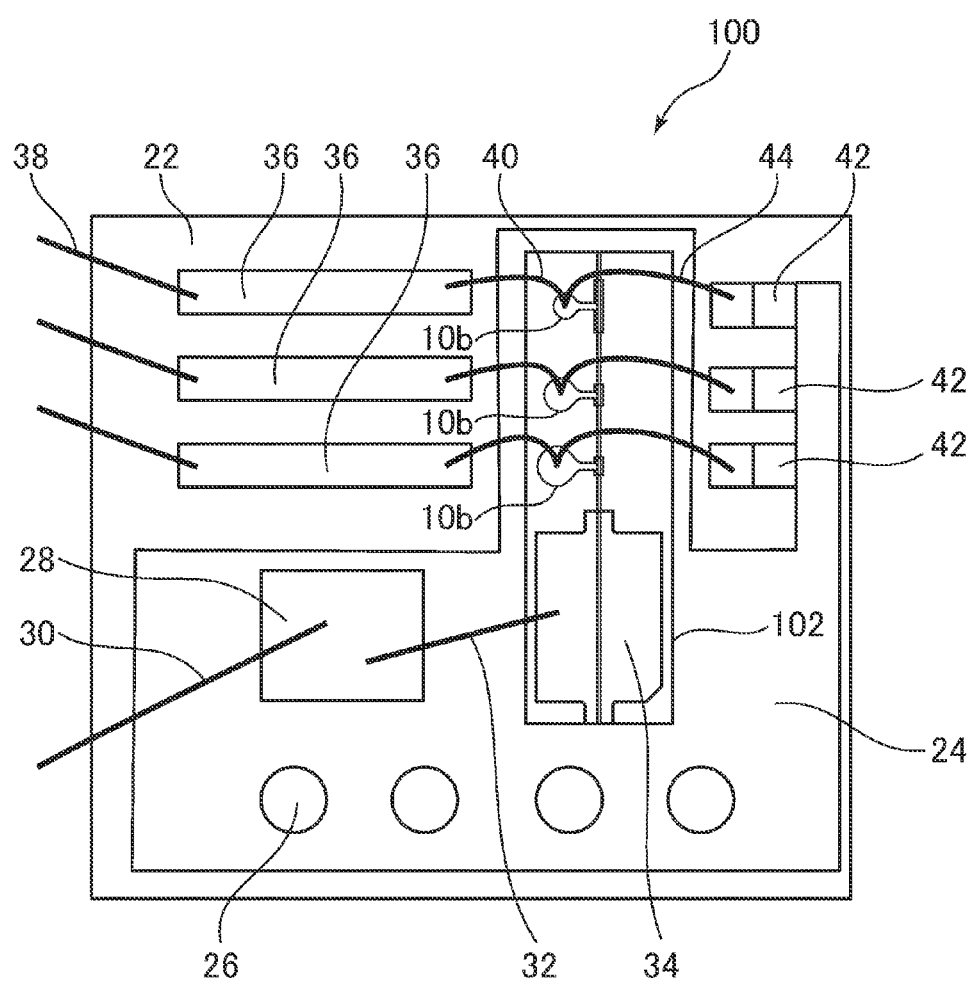
FIG. 4 is a schematic plan view of an optical device according to a second embodiment of the invention.

FIG. 4 is a schematic plan view of the optical device 100. On the chip carrier 22 of the optical device 100, there is mounted a modulator integrated semiconductor laser element 102 instead of the modulator integrated semiconductor laser element 2 described above. The modulator integrated semiconductor laser element 102 is different from the modulator integrated semiconductor laser element 2 according to the first embodiment in the point that the pad parts 10b respectively provided to the plurality of EA modulators 6 have respective sizes different from each other. Specifically, in the pad parts 10b of the respective EA modulators 6, the shorter the modulator length of the EA modulator 6 is, the larger area, the pad part 10b has.

When dividing the capacitance of the EA modulator 6 into the capacitance of the main body, namely a mesa stripe part, and the capacitance of the pad part 10b, the longer the modulator length is, the larger the capacitance of the main body part is. Therefore, in the case of making the area of the pad part 10b common to the EA modulators EA1 through EA3, the longer the modulator length is, the larger the total capacitance of the EA modulator 6 becomes. In this regard, in the present embodiment, the area of the pad part 10b is adjusted to make the capacitances of the EA modulators EA1 through EA3 equal to each other, or to decrease the difference between the capacitances of the EA modulators EA1 through EA3.

As already described, each of the EA modulators 6 operates in response to the drive signal, which has a voltage switched at a high frequency corresponding to the modulation signal, supplied from the modulator driver. In the present embodiment, by correcting the difference in capacitance between the EA modulators EA1 through EA3 using the areas of the pad parts 10b, the electrical characteristics of the EA modulators 6 viewed from the modulator drivers are uniformed, and thus, it is possible to achieve use of the drive condition in common between the EA modulators 6. Thus, it becomes possible to obtain the output light $S_{OUT}$ having signal intensity levels equally spaced using the modulator drivers 56 having the circuit configuration common to the modulator drivers or the output voltage common to the modulator drivers, and the terminating resistors (the thin film resistors 42) having the resistance value common to the terminating resistors to the EA modulators EA1 through EA3, and it becomes easy to generate the high-quality PAM optical signal.

Third Embodiment

The optical device 200 as the optical signal generator according to the third embodiment of the invention will hereinafter be described with a focus on a different point from the first embodiment described above attaching the same reference symbols to the common constituents to the first embodiment and the present embodiment, and basically omitting the description of the common constituents.

Figure 5:
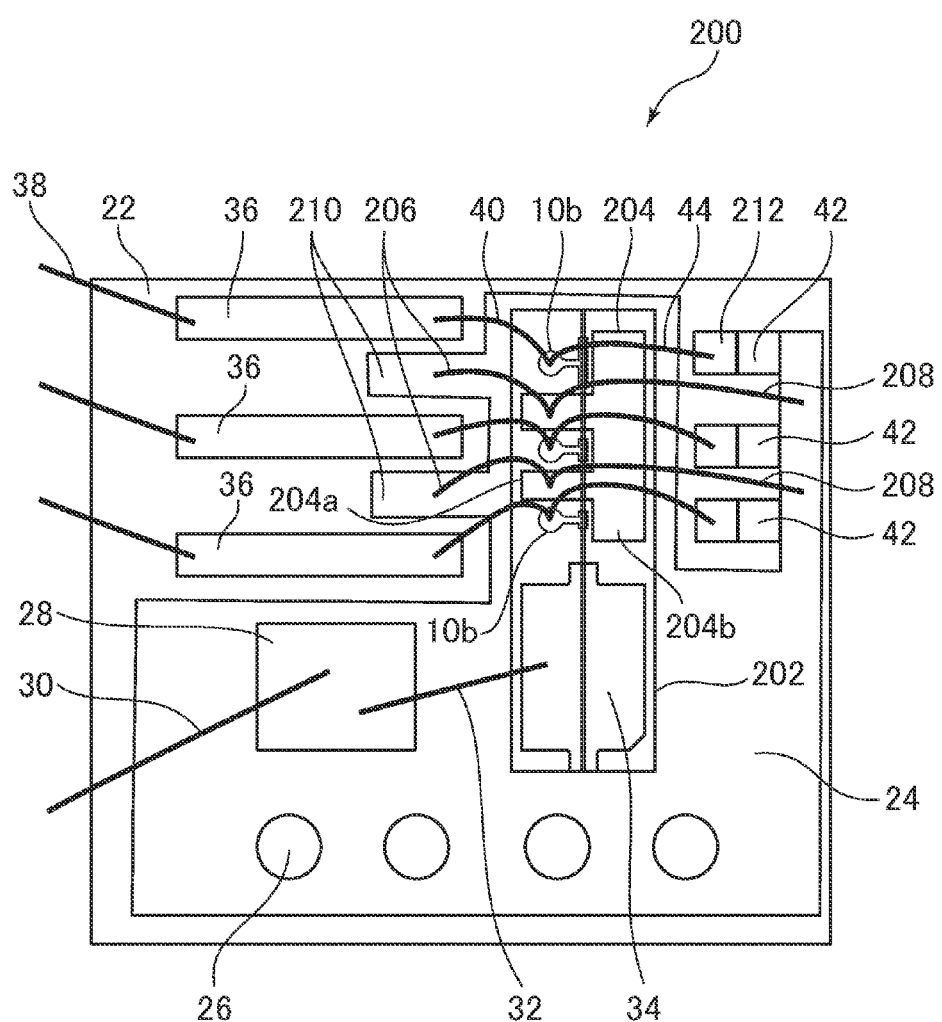
FIG. 5 is a schematic plan view of an optical device according to a third embodiment of the invention.

FIG. 5 is a schematic plan view of the optical device 200. On the chip carrier 22 of the optical device 200, there is mounted a modulator integrated semiconductor laser element 202 instead of the modulator integrated semiconductor laser element 2 described above. The modulator integrated semiconductor laser element 202 has a ground electrode 204 on the upper surface thereof.

The ground electrode 204 has a part (an electrode pad 204a), which is not electrically connected to either of the EA modulators 6, between at least either two of the EA modulators 6 disposed adjacent to each other. In the example shown in FIG. 5, the pad parts 10b of the EA modulators 6 are disposed on one side of the light path, and the electrode pads 204a are disposed between the pad parts 10b of the EA modulators EA1, EA2, and between the pad parts 10b of the EA modulators EA2, EA3, respectively. The ground electrode 204 has a part 204b extending along the EA modulators EA1 through EA3 located on the other side of the light path, and the electrode pads 204a are disposed extending from the part 204b to the spaces between the EA modulators 6 to form a comb-like shape.

Between the EA modulators 6 adjacent to each other, there are disposed bonding wires for connecting the electrode pads 204a and the DC power supply to each other. Specifically, as the bonding wires, there are provided wires 206 each disposed between the wires 40 of the two EA modulators 6 adjacent to each other, and wires 208 each disposed between the wires 44 of the two EA modulators 6 adjacent to each other. The wires 206, 208 are connected to the ground electrode 24 at one ends, and are thus grounded.

In the case of integrating the plurality of EA modulators 6 into a single element, the distance between the EA modulators 6 is shortened, and there is a possibility that the crosstalk occurs between the EA modulators 6 due to the mutual induction between the signal input wires. Therefore, by disposing the wires 206, 208, the crosstalk of the high-frequency signal between the EA modulators 6 due to the wires 40 connecting the pad parts 10b and the high-frequency lines 36 and the wires 44 connecting the pad parts 10b and the thin film resistors 42 is suppressed.

The ground electrode 24 of the chip carrier 22 is provided with, for example, extending parts 210 extending in gaps between the three high-frequency lines 36 disposed in parallel to each other. One wire 206 has one end bonded to the extending part 210 located between the high-frequency line 36 corresponding to the EA modulator EA1 and the high-frequency line 36 corresponding to the EA modulator EA2, and the other end bonded to the electrode pad 204a located between the EA modulator EA1 and the EA modulator EA2. Similarly, another wire 206 has one end bonded to the extending part 210 located between the high-frequency lines 36 of the EA modulator EA2 and the EA modulator EA3, and the other end bonded to the electrode pad 204a located between the EA modulator EA2 and the EA modulator EA3.

The wires 44 are connected to pad parts 212 each disposed on one end near to the EA modulator 6 out of the both ends of the thin film resistor 42, and the other ends of the thin film resistor 42 are connected to the ground electrode 24. One end of each of the two wires 208 is bonded to a part, to which the other end of the thin film resistor 42 is connected, in the ground electrode 24, and the other ends are respectively bonded to the electrode pad 204a located between the EA modulator EA1 and the EA modulator EA2 and the electrode pad 204a located between the EA modulator EA2 and the EA modulator EA3.

Fourth Embodiment

The optical signal generator according to the fourth embodiment of the invention will hereinafter be described with a focus on a different point from the first embodiment described above attaching the same reference symbols to the common constituents to the first embodiment and the present embodiment, and basically omitting the description of the common constituents.

Figure 6:
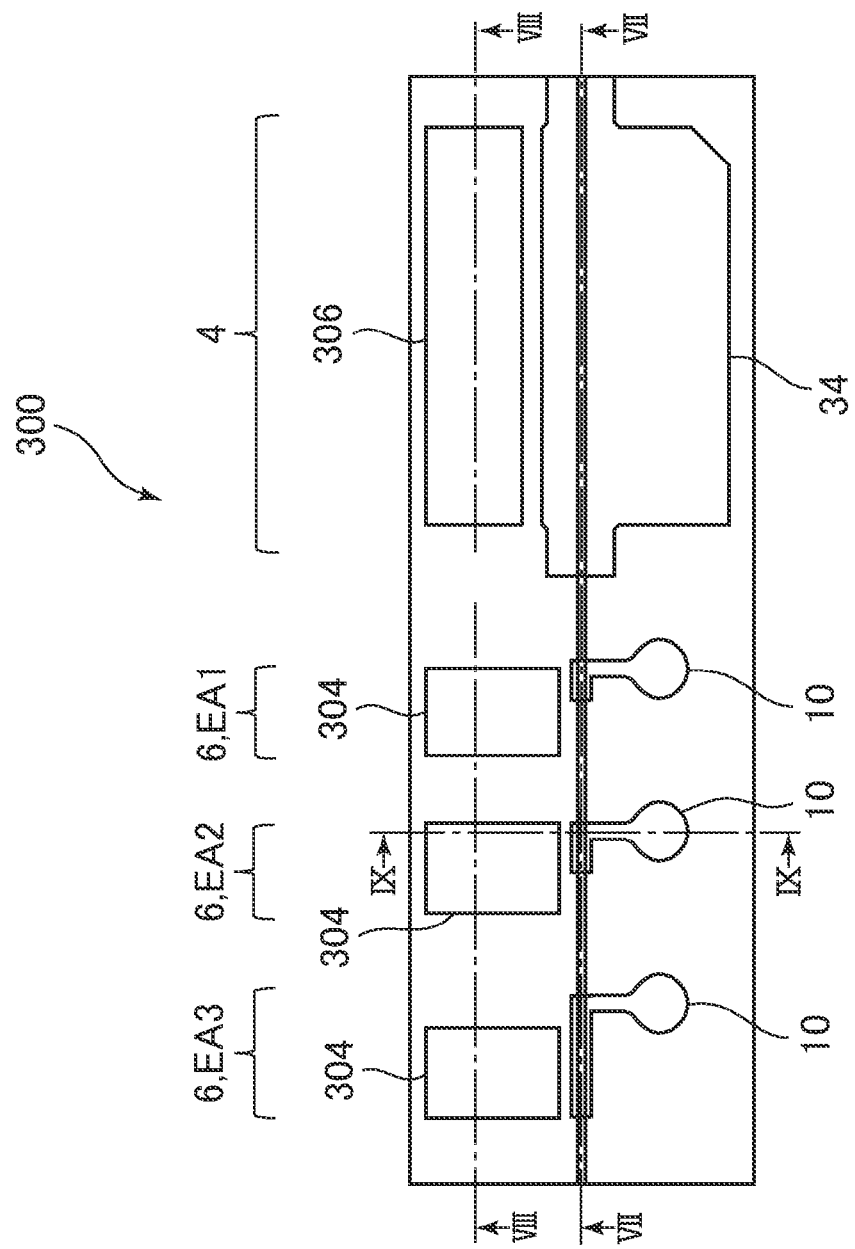
FIG. 6 is a schematic plan view of a modulator integrated semiconductor laser element according to a fourth embodiment of the invention.
Figure 7:
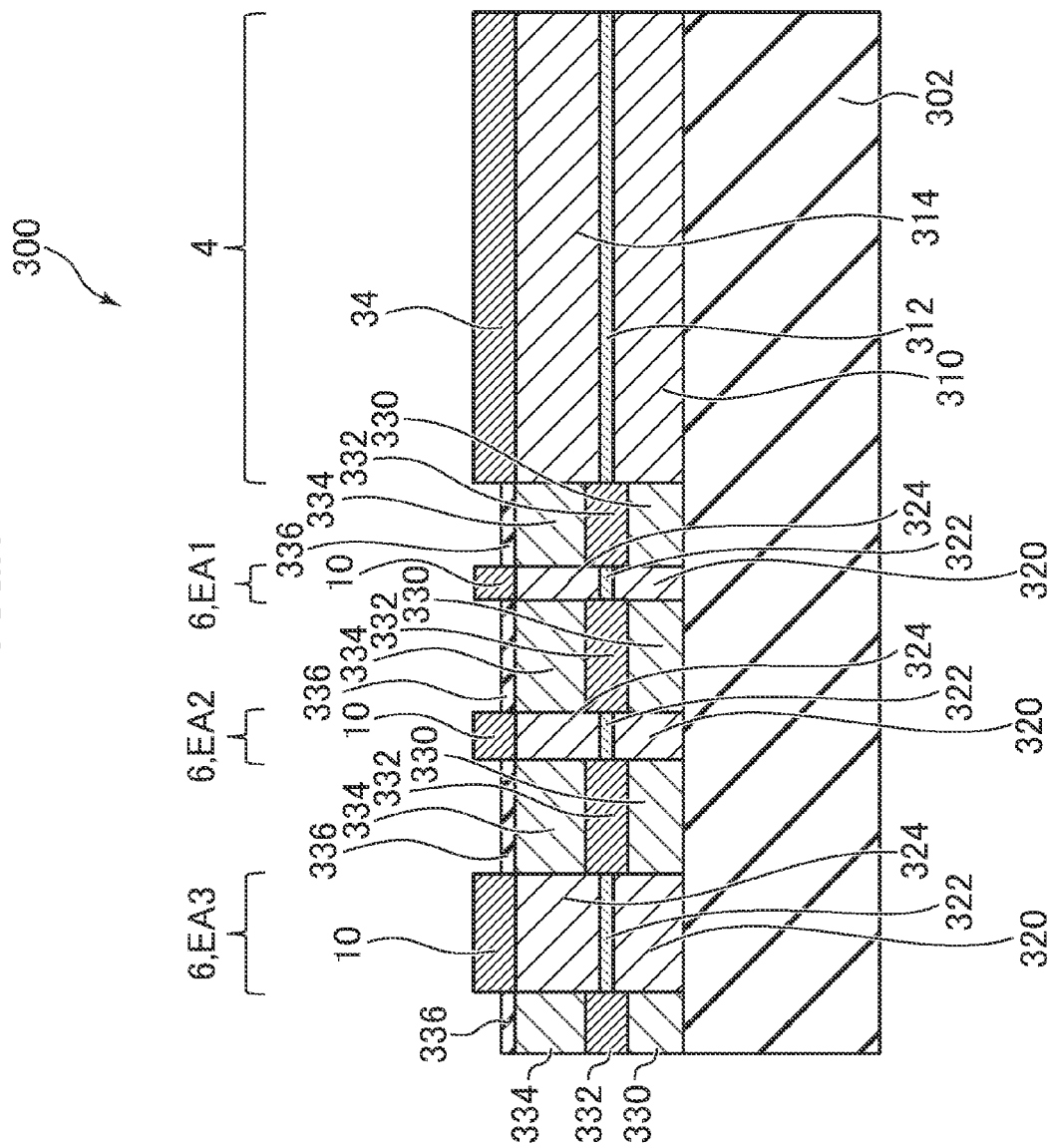
FIG. 7 is a schematic vertical cross-sectional view of the modulator integrated semiconductor laser element according to the fourth embodiment of the invention along the line VII-VII shown in FIG. 6.
Figure 8:
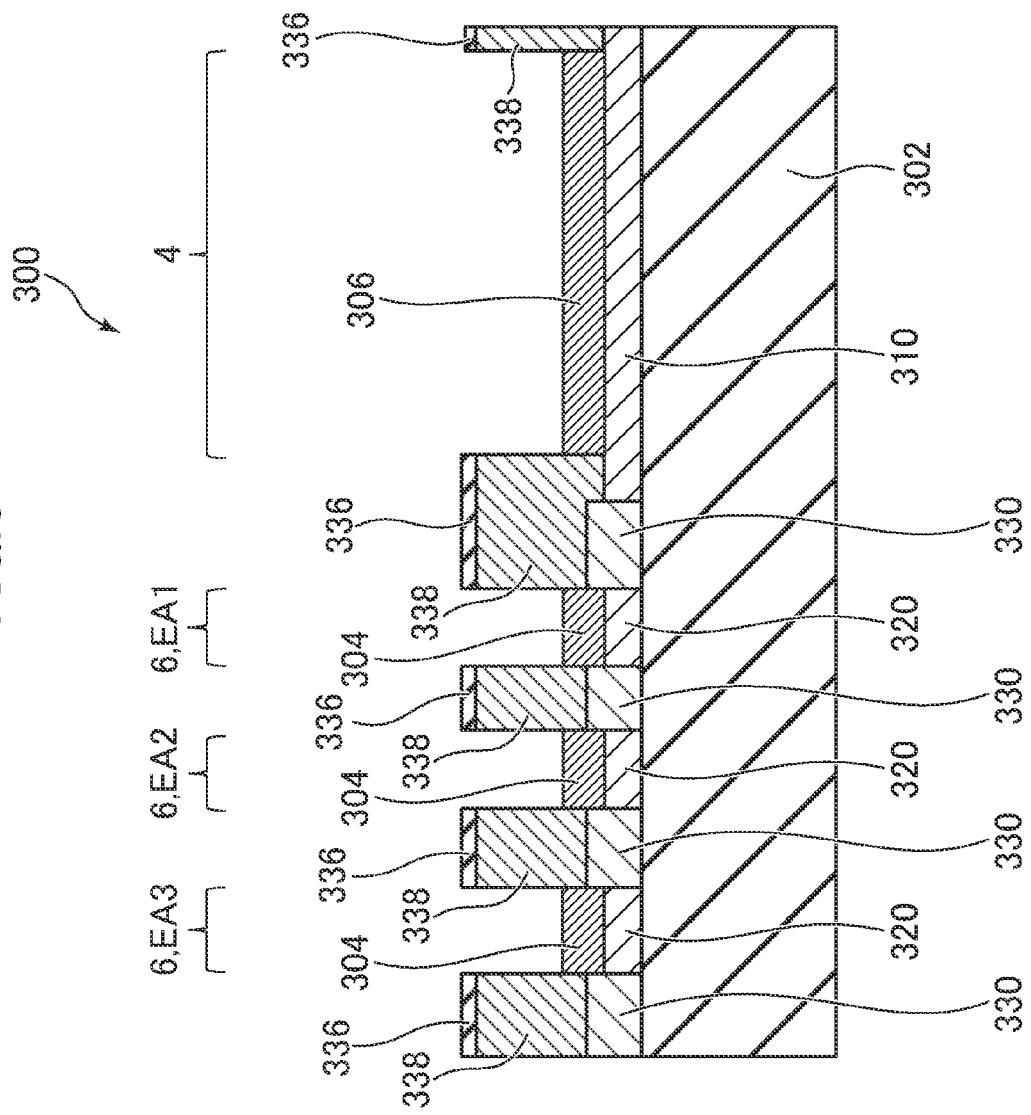
FIG. 8 is a schematic vertical cross-sectional view of the modulator integrated semiconductor laser element according to the fourth embodiment of the invention along the line VIII-VIII shown in FIG. 6.
Figure 9:
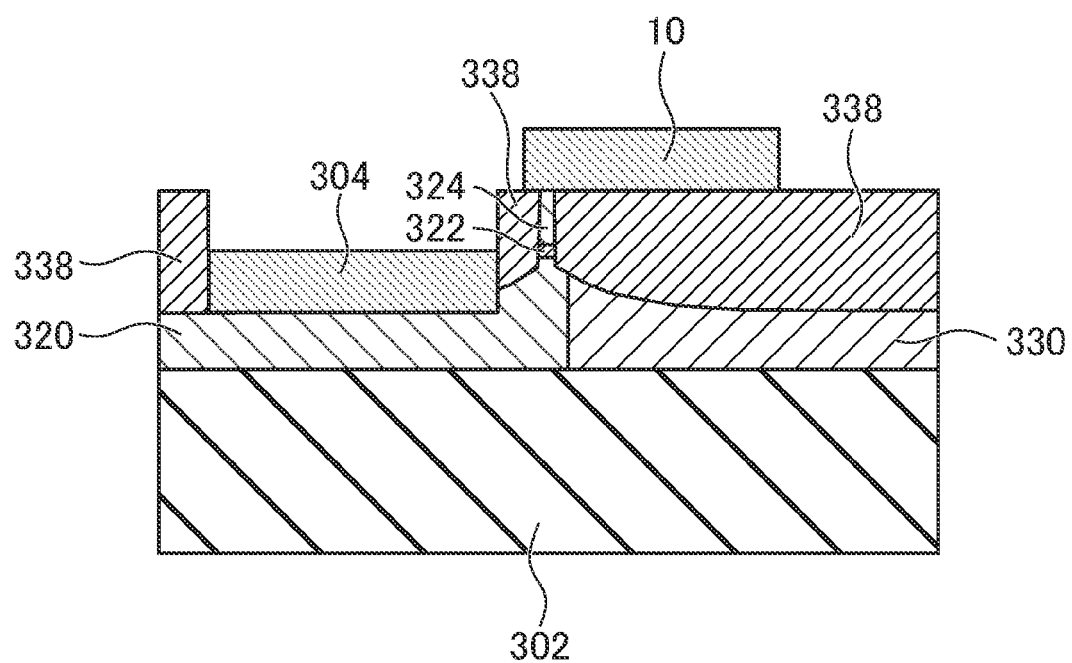
FIG. 9 is a schematic vertical cross-sectional view of the modulator integrated semiconductor laser element according to the fourth embodiment of the invention along the line IX-IX shown in FIG. 6.

FIG. 6 is a schematic plan view of the modulator integrated semiconductor laser element 300 as the optical signal generator according to the present embodiment. FIG. 7 is a schematic vertical cross-sectional view along the line VII-VII shown in FIG. 6, FIG. 8 is a schematic vertical cross-sectional view along the line VIII-VIII shown in FIG. 6, and FIG. 9 is a schematic vertical cross-sectional view along the line IX-IX shown in FIG. 6.

The modulator integrated semiconductor laser element 300 is formed on a semi-insulating InP substrate 302, and positive and negative driving electrode pads for connecting interconnections for supplying the EA modulator 6 and the DFB laser part 4 with the drive voltage are both disposed on a principal surface of the modulator integrated semiconductor laser element 300 opposite to the semi-insulating InP substrate 302. Specifically, on the upper surface of the modulator integrated semiconductor laser element 300, there are disposed an n electrode part 304 of the EA modulator 6 and an n electrode part 306 of the DFB laser part 4 in addition to the p electrode part 10 of the EA modulator 6 and the p electrode part 34 of the DFB laser part 4 already described as the driving electrode pads. Here, the p electrode parts 10, 34 are defined as positive terminals, and the n electrode parts 304, 306 are defined as negative terminals.

FIG. 7 shows a vertical cross-sectional structure of the modulator integrated semiconductor laser element 300 along the mesa stripe. In the DFB laser part 4, an n-InP layer 310, an MQW active layer 312, a p-InP layer 314, and the p electrode part 34 are stacked in sequence on the semi-insulating InP substrate 302.

Further, in the part corresponding to the EA modulator 6, an n-InP layer 320, an MQW active layer 322, a p-InP layer 324, and the p electrode part 10 are stacked in sequence on the semi-insulating InP substrate 302.

In the part corresponding to the waveguide 8, a lower undoped InP layer 330, a waveguide layer 332, an upper undoped InP layer 334, and an insulating film 336 are stacked in sequence on the semi-insulating InP substrate 302.

FIG. 8 shows a vertical cross-sectional structure of the modulator integrated semiconductor laser element 300 along the line VIII-VIII passing through the n electrode parts 304, 306 and parallel to the mesa stripe. In the DFB laser part 4, the n-InP layer 310 disposed commonly to the mesa stripe part, a high resistance InP layer 338, and an insulating film 336 are stacked in sequence on the semi-insulating InP substrate 302, and the n electrode part 306 is stacked on the n-InP layer 310 exposed from an opening part formed in the high resistance InP layer 338 and the insulating film 336.

In the part corresponding to the EA modulator 6, the n-InP layer 320 disposed commonly to the mesa stripe part, a high resistance InP layer 338, and the insulating film 336 are stacked in sequence on the semi-insulating InP substrate 302, and the n electrode part 304 is stacked on the n-InP layer 320 exposed from an opening part formed in the high resistance InP layer 338 and the insulating film 336.

In the part corresponding to the waveguide 8, the lower undoped InP layer 330, the high resistance InP layer 338, and the insulating film 336 are stacked in sequence on the semi-insulating InP substrate 302.

FIG. 9 shows a vertical cross-sectional structure along the line IX-IX passing through the part corresponding to the EA modulator 6 and crossing the mesa stripe. On the mesa stripe, the contact part 10a of the p electrode part 10 has contact with the p-InP layer 324. Further, the n electrode part 304 has contact with the n-InP layer 320 disposed commonly to the mesa stripe part. Incidentally, in the DFB laser part 4, the p electrode part 34, the n electrode part 306 also have contact with the p-InP layer 314, the n-InP layer 310, respectively, with roughly the same structure as shown in FIG. 9.

In the modulator integrated semiconductor laser element 300, by forming the EA modulator 6 and the DFB laser part 4 on the semi-insulating substrate, the capacitance of the driving electrode pad can be reduced. For example, in the element using the n-InP substrate, the entire substrate becomes the negative terminal on the one hand, and the area of the negative terminal can be reduced to achieve the reduction of capacitance in the modulator integrated semiconductor laser element 300, on the other hand.

Figure 10:
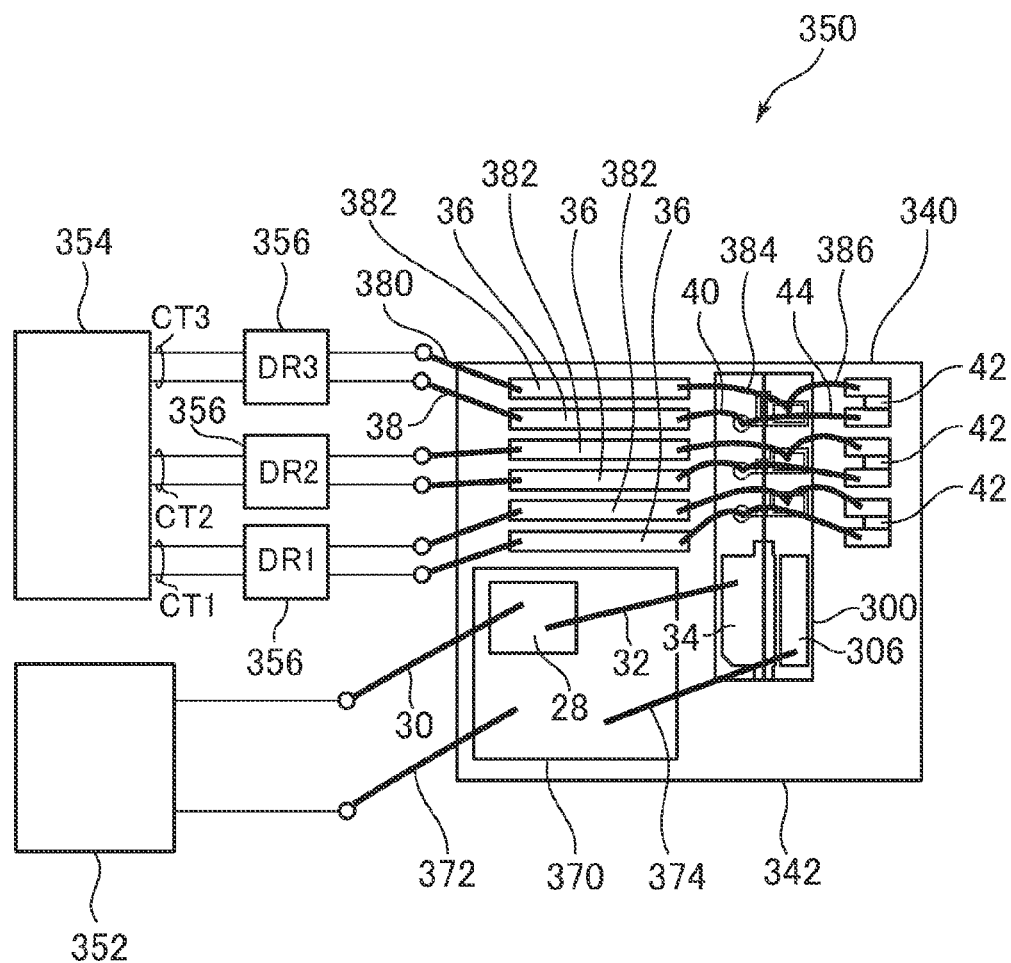
FIG. 10 is a schematic diagram of an optical transmitter module according to the fourth embodiment of the invention.

FIG. 10 is a schematic diagram of an optical transmitter module 350 configured using the modulator integrated semiconductor laser element 300. The optical transmitter module 350 is also an aspect of the optical signal generator according to the invention. The optical transmitter module 350 includes an optical device 340, a laser driver 352, a modulation control section 354, and modulator drivers 356. The optical device 340 includes the modulator integrated semiconductor laser element 300, the thin film resistors 42, the chip capacitor 28, and so on.

In the modulator integrated semiconductor laser element 2 according to the first embodiment, the negative terminals of the DFB laser part 4 and the EA modulator 6 are connected by the n-InP substrate. Therefore, the drive signal is basically a single-ended signal applied only to the positive terminal. In contrast, since in the modulator integrated semiconductor laser element 300, the negative terminals of the EA modulators 6 and the DFB laser part 4 are formed separately from each other, it is possible to achieve the differential signal drive. The optical transmitter module 350 is different from the optical transmitter module 50 in the point that the differential signal drive is adopted.

Specifically, the laser driver 352 and the modulator drivers 356 each output the differential signal. Further, in the optical device 340, the path of the reversed-phase signal is separately provided for each of the differential signals. For example, an electrode 370 is formed on the upper surface of the chip carrier 342 of the optical device 340 so as to correspond to the reversed-phase signal of the laser driver 352, and the chip capacitor 28 is mounted on the electrode 370. The normal phase terminal of the laser driver 352 is connected to the p electrode part 34 of the DFB laser part 4 of the modulator integrated semiconductor laser element 300 via the wire 30, the electrode of the chip capacitor 28, and the wire 32, and the reversed-phase terminal is connected to the n electrode part 306 of the DFB laser part 4 via a wire 372, the electrode 370, and a wire 374. The normal phase terminal of each of the modulator driver 356 is connected to the p electrode part 10 of the EA modulator 6 via the wire 38, the high-frequency line 36, and the wire 40, and the reversed-phase terminal is connected to the n electrode part 304 of the EA modulator 6 via a wire 380, a high-frequency line 382, and a wire 384. It should be noted that one ends of the terminating resistors formed of the thin film resistors 42 are connected to the p electrode parts 10 via the wires 44, and the other ends are connected to the n electrode parts 304 via the wires 386, respectively.

Except the difference in the transmission system of the signal, namely between the single-ended signals and the differential signals, the laser driver 352, the modulation control section 354, and the modulator drivers 356 function basically similarly to the laser driver 52, the modulation control section 54, and the modulator drivers 56 of the first embodiment.

Fifth Embodiment

The optical signal generator according to the fifth embodiment of the invention will hereinafter be described with a focus on a different point from the embodiments described above attaching the same reference symbols to the common constituents to the embodiments described above and the present embodiment, and basically omitting the description of the common constituents.

Figure 11:
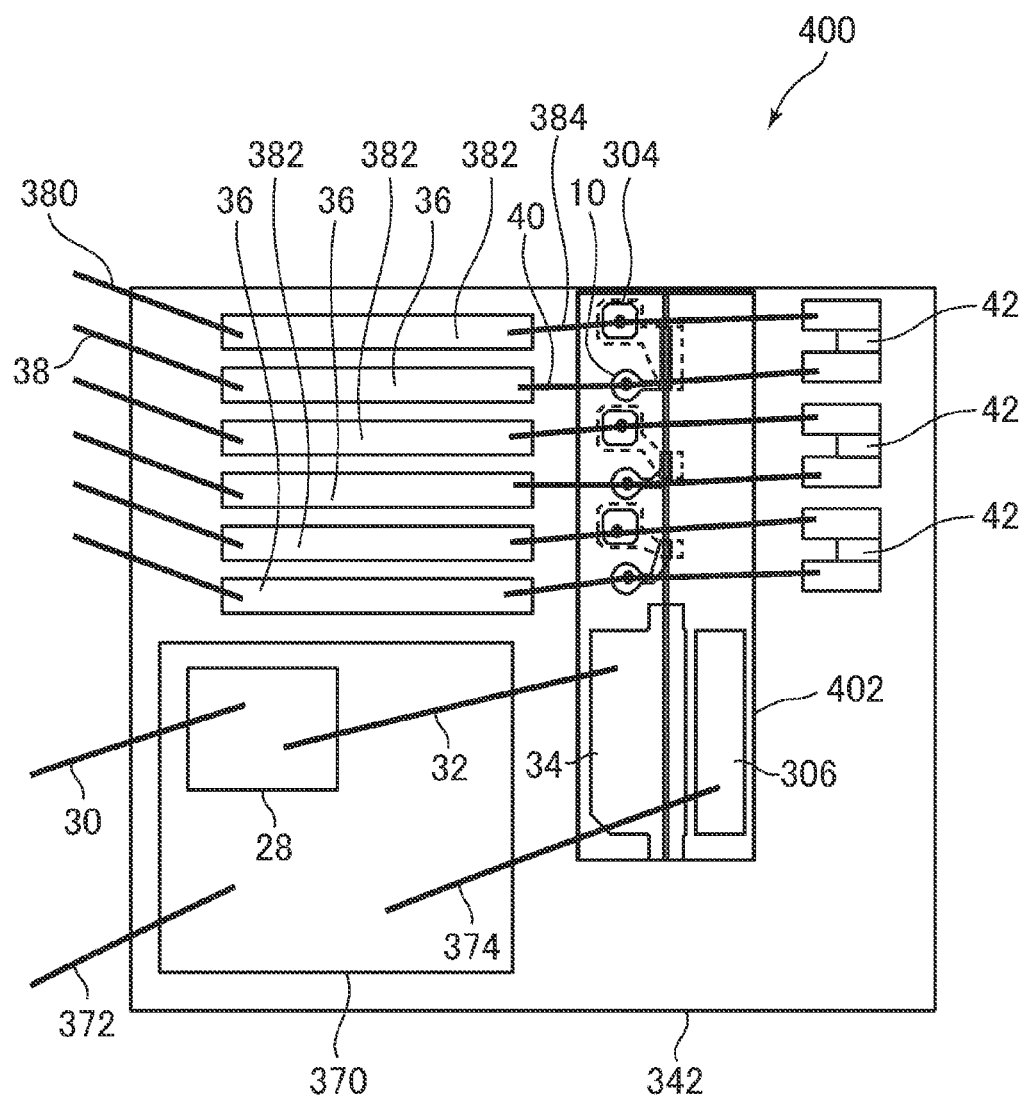
FIG. 11 is a schematic plan view of an optical device according to a fifth embodiment of the invention.

FIG. 11 is a schematic plan view of the optical device 400. In the optical device 400, a modulator integrated semiconductor laser element 402 is mounted on the chip carrier 342. Similarly to the modulator integrated semiconductor laser element 300 according to the fourth embodiment, the modulator integrated semiconductor laser element 402 is formed on the semi-insulating InP substrate 302, and the p electrode part 10 and the n electrode part 304 of the EA modulator 6 and the p electrode part 34 and the n electrode part 306 of the DFB laser part 4 are disposed on the principal surface on the opposite side to the semi-insulating InP substrate 302. The point in which the modulator integrated semiconductor laser element 402 is different from the modulator integrated semiconductor laser element 300 is the point that the n electrode part 304 of each of the EA modulators 6 is disposed on the same side as the p electrode part 10 when viewed from the mesa stripe. Thus, the modulator integrated semiconductor laser element 402 can be disposed on the chip carrier 342 so that both of the p electrode part 10 and the n electrode part 304 come closer to the high-frequency lines 36, 382, and since the wire length of the wires 40, 384 for inputting the drive signals becomes shorter, the band characteristics with respect to the drive signals can be improved.

It should be noted that the optical device 340 equipped with the modulator integrated semiconductor laser element 402 can be incorporated in the optical transmitter module 350 using the differential signal drive similar to the fourth embodiment.

Sixth Embodiment

The optical signal generator according to the sixth embodiment of the invention will hereinafter be described with a focus on a different point from the embodiments described above attaching the same reference symbols to the common constituents to the embodiments described above and the present embodiment, and basically omitting the description of the common constituents.

Figure 12:
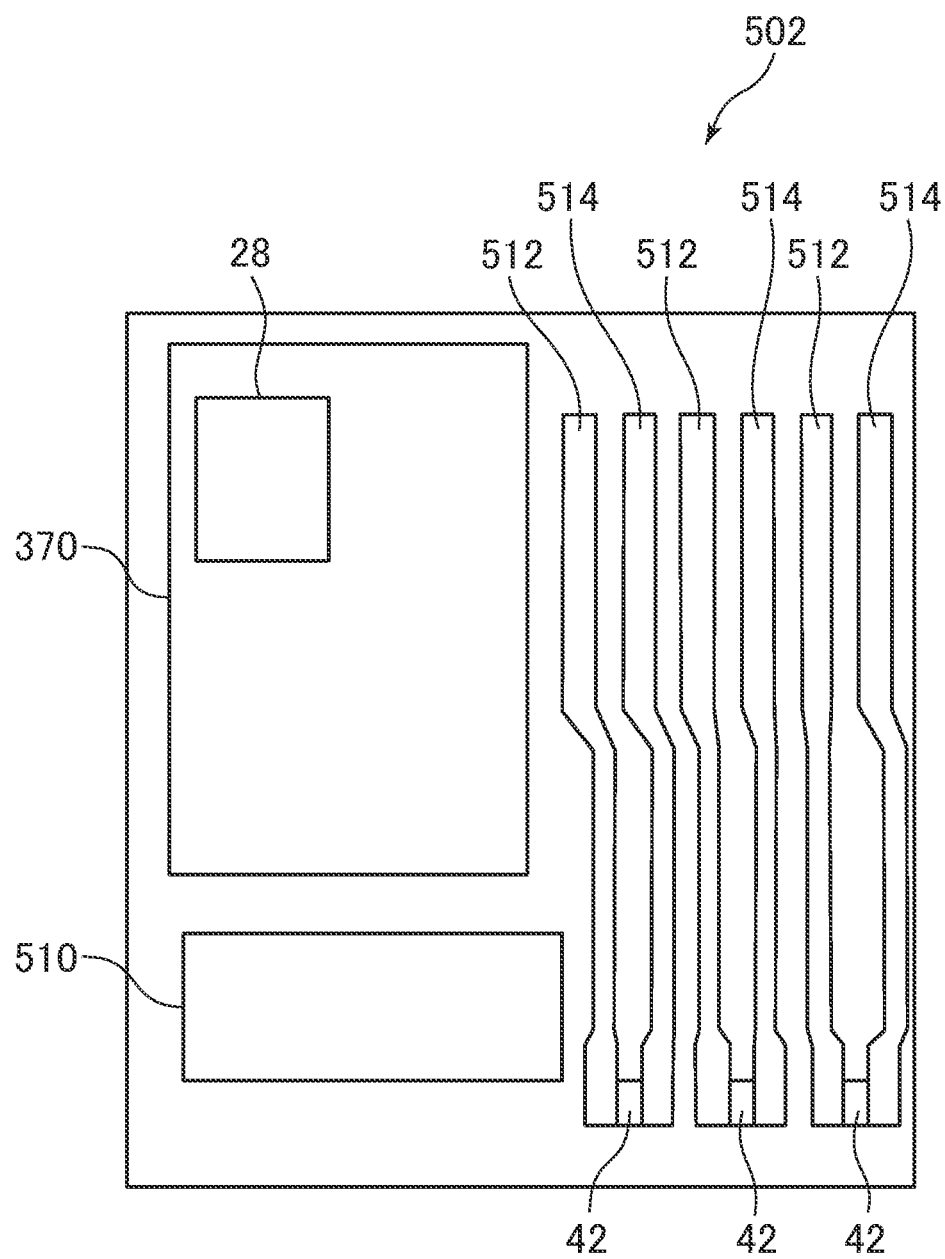
FIG. 12 is a schematic plan view of a chip carrier of an optical device according to a sixth embodiment of the invention.

In the optical device 500 according to the present embodiment, the modulator integrated semiconductor laser element 402 described above is implemented. FIG. 12 is a schematic plan view of a chip carrier 502 of the optical device 500. The modulator integrated semiconductor laser element 402 is mounted on the chip carrier 502 so that the principal surface provided with the driving electrode pads faces downward. The chip carrier 502 has a layout of the electrodes and so on corresponding to the mounting. Specifically, the electrode 510 is disposed at the position opposed to the p electrode part 34 of the DFB laser part 4. Electrodes 512 correspond to the high-frequency lines 36, the wires 40, 44 in the optical device 340 according to the fourth embodiment shown in FIG. 10, and electrodes 514 correspond to the high-frequency lines 382, the wires 384, 386 in the optical device 340. The electrodes 512, 514 are laid out so that the p electrode parts 10 and the n electrode parts 304 of the EA modulators EA1 through EA3 of the optical device 340 mounted on the chip carrier 502 are able to be opposed to the electrodes 512, 514.

Figure 13:
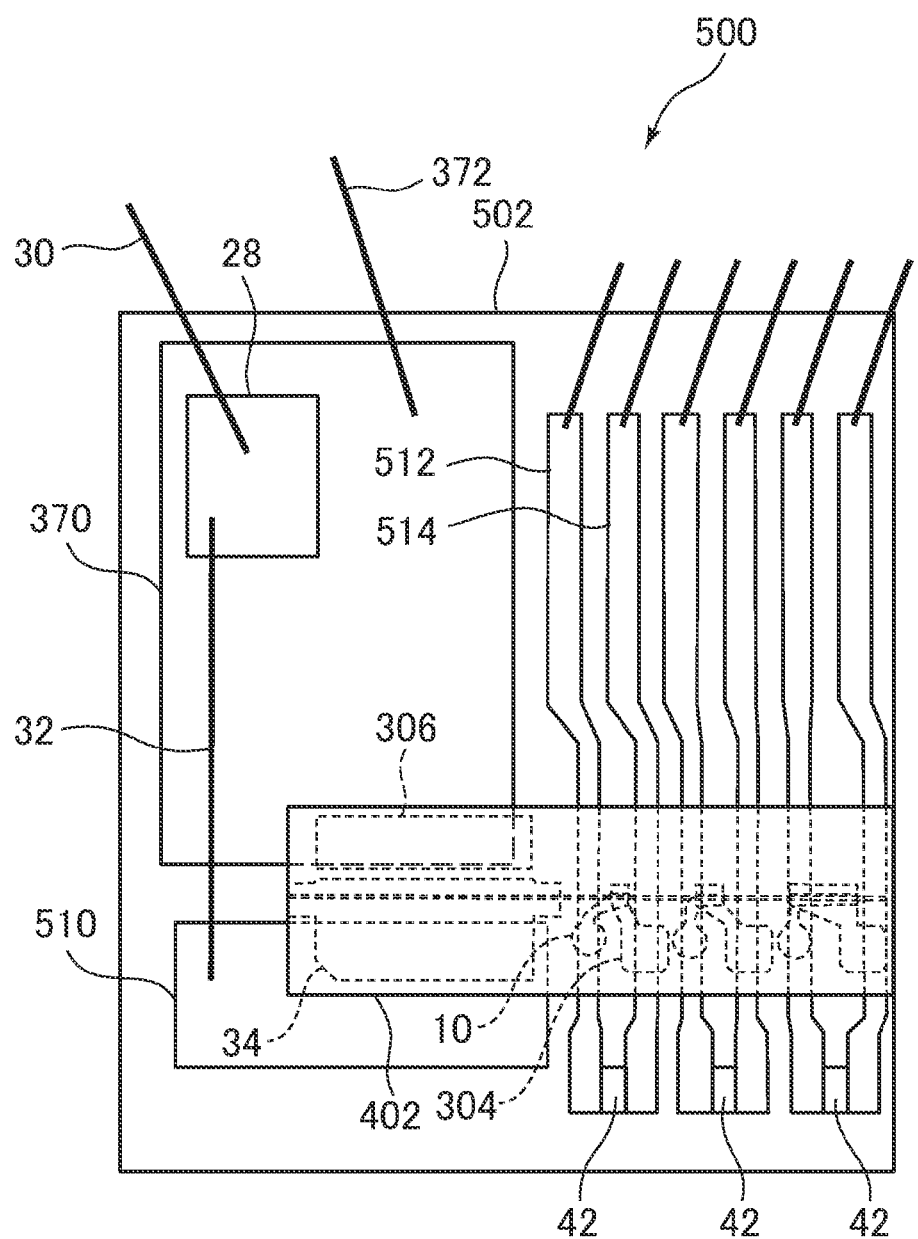
FIG. 13 is a schematic plan view of the optical device according to the sixth embodiment of the invention.
Figure 14:
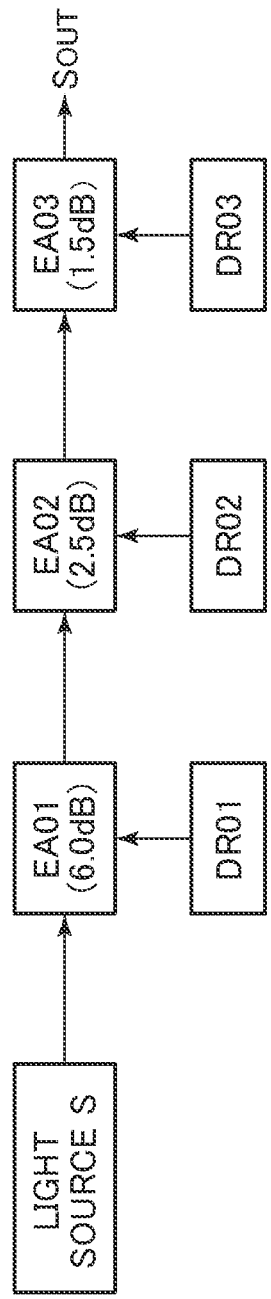
FIG. 14 is the block diagram for explaining the problems of the optical transmitter module for generating the PAM4 signal using the EA modulators.

FIG. 13 is a schematic plan view of the optical device 500 according to the present embodiment, and shows the state in which the modulator integrated semiconductor laser element 402 is mounted on the chip carrier 502. The p electrode parts 10 of the EA modulators EA1 through EA3 have contact with the electrodes 512, respectively, and the n electrode parts 304 have contact with the electrodes 514, respectively. Further, the p electrode part 34 and the n electrode part 306 of the DFB laser part 4 have contact with the electrodes 510, 370, respectively. Thus, the wires 40, 44, 384, 386, and 374 used in the fourth embodiment can be eliminated, and thus the mounting process is simplified.

For example, the electrical connection at the opposed parts of the electrodes between the modulator integrated semiconductor laser element 402 and the chip carrier 502 is achieved by soldering using a reflow process.

It should be noted that although in each of the embodiments described above, there is shown a configuration example in the 4-level PAM as the multilevel coding, the invention can be applied to the PAM with an arbitrary number of levels no smaller than three.

Further, although an element having the light source formed of the semiconductor laser and the plurality of EA modulators formed integrally with each other is illustrated as the semiconductor element related to the optical signal generator according to the invention, it is also possible for the semiconductor element related to the optical signal generator according to the invention to be an element not including the light source, and modulating an optical signal from a light source located outside the element with the plurality of EA modulators.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical signal generator provided with a plurality of modulation parts connected in series in a path of an optical signal, and configured to generate a multilevel-coded modulated optical signal by modulating an intensity of an input optical signal from a light source based on a modulation signal, the optical signal generator comprising:
    a plurality of electro-absorption optical modulators are respectively provided to each of the modulation parts, and the electro-absorption optical modulators are switched between an ON state of optical absorption and an OFF state of the optical absorption in accordance with the modulation signal; and
    a control section configured to generate a binary control signal used to control switching between the ON state and the OFF state of each of the modulation parts from the modulation signal,
    wherein each of the modulation parts has a respective extinction ratio of the ON state to the OFF state, and the extinction ratios of at least two of the modulation parts are different from each other,
    wherein the modulation parts are located so that the lower the extinction ratio is of the respective modulation part, the closer to the light source the respective modulation part is located,
    wherein a number of the modulation parts is (N−1) with respect to N levels of the multilevel-coded modulated optical signal,
    wherein threshold values $\lambda_k$ arranged in one of ascending order and descending order with respect to a change in k are determined in advance for switching between ON state and the OFF state of the $k^{th}$ modulation part from a light source side, where k is defined as an arbitrary natural number satisfying 1≤k≤N−1, and wherein the control section is further configured to compare the modulation signal with the threshold values for each of the modulation parts, and then generates the control signal for setting the $\alpha^{th}$ modulation part to the ON state in a case in which the modulation signal exists in a region on a $\lambda_{\alpha+1}$ side viewed from $\lambda_\alpha$, and generates the control signal for setting the $\beta^{th}$ modulation part to the OFF state in a case in which the modulation signal exists in a region on a $\lambda_{\beta-1}$ side viewed from $\lambda_\beta$, where $\alpha$ is an arbitrary natural number satisfying 1≤α≤N−2 and β is an arbitrary natural number satisfying 2≤β≤N−1.

2. The optical signal generator according to claim 1, wherein each of the plurality of modulation parts has a respective modulator length, and lower the extinction ratio is of the respective modulation part, the shorter the modulator length of the electro-absorption optical modulator of the respective modulation part.

3. The optical signal generator according to claim 1, wherein when setting one of the electro-absorption optical modulators to the ON state, all of the electro-absorption optical modulators located on the light source side of the one of the electro-absorption optical modulators in the path are also set to the ON state.

4. The optical signal generator according to claim 1, wherein the extinction ratios of all of the modulation parts are different from each other, and the modulation parts are arranged in ascending order of the extinction ratios from the light source side.

5. The optical signal generator according to claim 2, wherein each of the modulation parts has a drive circuit configured to apply drive voltages corresponding to the OFF state and the ON state to the electro-absorption optical modulator thereof, and the drive voltages are common to the modulation parts.

6. The optical signal generator according to claim 4, wherein each of the modulation parts has a drive circuit configured to apply drive voltages corresponding to the OFF state and the ON state to the electro-absorption optical modulator thereof, and the drive voltages are common to the modulation parts.

7. The optical signal generator according to claim 2, wherein each of the electro-absorption optical modulators is provided to an optical semiconductor element and have a respective driving electrode pad connected to a wire for supplying the drive voltages thereof, and in each of the modulation parts, the shorter the modulator length of the electro-absorption optical modulator thereof, the larger an area of the driving electrode pad thereof.

8. The optical signal generator according to claim 4, wherein each of the electro-absorption optical modulators is provided to an optical semiconductor element and have a respective driving electrode pad connected to a wire for supplying the drive voltages thereof, and in each of the modulation parts, the shorter the modulator length of the electro-absorption optical modulator thereof, the larger an area of the driving electrode pad thereof.

9. The optical signal generator according to claim 5, wherein each of the electro-absorption optical modulators is provided to an optical semiconductor element and have a respective driving electrode pad connected to a wire for supplying the drive voltages thereto, and in each of the modulation parts, the shorter the modulator length of the electro-absorption optical modulator thereof, the larger an area of the driving electrode pad thereof.

10. The optical signal generator according to claim 6, wherein each of the electro-absorption optical modulators is provided to an optical semiconductor element and have a respective driving electrode pad connected to a wire for supplying the drive voltages thereto, and in each of the modulation parts, the shorter the modulator length of the electro-absorption optical modulator thereof, the larger an area of the driving electrode pad thereof.

11. An optical signal generator provided with a plurality of modulation parts connected in series in a path of an optical signal, and configured to generate a multilevel-coded modulated optical signal by modulating an intensity of an input optical signal from a light source based on a modulation signal, the optical signal generator comprising:

a plurality of electro-absorption optical modulators are respectively provided to each of the modulation parts, and the electro-absorption optical modulators are switch between an ON state of optical absorption and an OFF state of the optical absorption in accordance with the modulation signal; and a control section configured to generate a binary control signal used to control switching between the ON state and the OFF state of each of the modulation parts from the modulation signal, wherein each of the modulation parts has a respective extinction ratio of the ON state to the OFF state, and the extinction ratios of at least two of the modulation parts are different from each other, wherein the modulation parts are located so that the lower the extinction ratio is of the respective modulation part, the closer to the light source the respective modulation part is located, wherein the electro-absorption optical modulators of the respective modulation parts are arranged along the path of the optical signal to form an optical semiconductor element, and the optical semiconductor element has an electrode pad disposed between at least two of the electro-absorption optical modulators disposed adjacent to the electrode pad and which is not electrically connected to the at least two of the electro-absorption optical modulators disposed adjacent to the electrode pad, and wherein a bonding wire is configured to connect the electrode pad and a direct-current power supply and is disposed between the at least two of the electro-absorption optical modulators disposed adjacent to the electrode pad.

12. An optical signal generator provided with a plurality of modulation parts connected in series in a path of an optical signal, and configured to generate a multilevel-coded modulated optical signal by modulating an intensity of an input optical signal from a light source based on a modulation signal, the optical signal generator comprising:
  a plurality of electro-absorption optical modulators are respectively provided to each of the modulations parts, and the electro-absorption optical modulators are switched between an ON state of optical absorption and an OFF state of the optical absorption in accordance with the modulation signal; and
  a control section configured to generate a binary control signal used to control switching between the ON state and the OFF state of each of the modulation parts from the modulation signal,
  wherein each of the modulation parts has a respective extinction ratio of the ON state to the OFF state, and the extinction ratios of at least two of the modulation parts are different from each other,
  wherein the modulation parts are located so that the lower the extinction ratio is of the respective modulation part, the closer to the light source the respective modulation part is located,
  wherein the electro-absorption optical modulators are provided to an optical semiconductor element formed on a semi-insulating substrate, and
  wherein a plurality of driving electrode pads, including a plurality of positive terminals and a plurality of negative terminals to which a plurality of wires for supplying the electro-absorption optical modulators with drive voltages are connected, are disposed on a principal surface of the optical semiconductor element opposite to the semi-insulating substrate.

13. The optical signal generator according to claim 12, further comprising:
  a chip carrier on which the optical semiconductor element is mounted,
  wherein the optical semiconductor element is mounted on the chip carrier so that the principal surface, on which the driving electrode pads are disposed, faces downward.

* * * * *